United States Patent [19]

Barkan et al.

[11] 3,899,713

[45] Aug. 12, 1975

[54] TOUCH LAMP, LATCHING AC SOLID STATE TOUCH SWITCH USABLE WITH SUCH LAMP, AND CIRCUITS FOR THE SAME

[75] Inventors: Harold Barkan, Ardsley, N.Y.; George E. Brayman, Stamford, Conn.; Jerome Swartz, Stony Brook, N.Y.

[73] Assignee: Hall-Barkan Instruments, Inc., Tuckahoe, N.Y.

[22] Filed: June 20, 1974

[21] Appl. No.: 481,304

Related U.S. Application Data

[63] Continuation of Ser. No. 215,863, Jan. 6, 1972, abandoned.

[52] U.S. Cl. .................. 315/34; 307/252; 307/308; 315/205; 315/353; 328/5

[51] Int. Cl.².......................................... H05B 41/16

[58] Field of Search ................ 307/252, 308; 328/5; 315/34, 72, 200, 205, 353, 362

[56] References Cited

UNITED STATES PATENTS

| | | | |
|---|---|---|---|
| 2,896,131 | 7/1959 | Schumann | 200/DIG. 1 |
| 3,307,071 | 2/1967 | Diamond | 328/1 |
| 3,320,437 | 5/1967 | Myers | 200/DIG. 1 |
| 3,320,438 | 5/1967 | Myers | 200/DIG. 1 |
| 3,493,791 | 2/1970 | Adelson et al. | 307/252 N |
| 3,530,310 | 9/1970 | Adelson et al. | 307/305 |
| 3,530,312 | 9/1970 | Adelson et al. | 307/305 |
| 3,549,909 | 12/1970 | Adelson et al. | 328/5 |
| 3,648,076 | 3/1972 | Lester | 307/308 |
| 3,660,688 | 5/1972 | Evans et al. | 30'/308 |
| 3,666,988 | 5/1972 | Bellis | 307/252 N |
| 3,679,910 | 7/1972 | Williams | 307/308 |

OTHER PUBLICATIONS

S. B. Gray, Sourcebook of Electronic Circuits, pg. 85, 1968 (Markus).

Bechtold, Electronic Circuits Manual, pg. 94 (Markus 1971).

E. K. Howell, Electronic Circuits Manual, pg. 347 (Markus 1971).

E. K. Howell, Electronic Circuits Manual, pg. 349 (Markus 1971).

*Primary Examiner*—John Kominski

*Attorney, Agent, or Firm*—Kirschstein, Kirschstein, Ottinger & Frank

[57] ABSTRACT

A lamp having at least two areas such that when one is touched a solid state latching AC powered switch turns the lamp on and when another is touched the latching action is disabled to turn the lamp off. Circuits are disclosed utilizing solid state avalanche-type devices which have a simple arrangement for maintaining the devices latched in conducting mode during commutating periods. The switches and circuits may be of the two- or three-wire type and have general utility as well as specialized utility for touch lamps. A single area can be employed to control a solid state latching AC powered switch to successively turn a lamp on and off upon sequential touching thereof.

8 Claims, 2 Drawing Figures

TOUCH LAMP, LATCHING AC SOLID STATE TOUCH SWITCH USABLE WITH SUCH LAMP, AND CIRCUITS FOR THE SAME

This is a continuation of application Ser. No. 215,863 filed Jan. 6, 1972, now abandoned.

BACKGROUND OF THE INVENTION

1. Field of the Invention

Touch lamps, AC latching touch switches, and circuits for such switches utilizing solid state avalanche-type devices.

2. Description of the Prior Art

It has been proposed heretofore to provide lamps having touch responsive means to turn the lamp on and off. Such lamps utilized a mechanical stepping means such as a pawl and ratchet, activated by a touch control, to mechanically open and close a lamp switch. Accordingly, the arrangement involved a degree of mechanical complexity and reliance upon mechanical components. It also needed mechanical assembly and was subject to the ever-present possibility of mechanical breakdown.

Another type of touch actuated lamp employed a touch control to turn the lamp on and a mechanical arrangement for turning the lamp off. Thus, it, too, involved the use of mechanically operated parts along with their requirement for assembly and the possibility of mechanical breakdown.

It has also been suggested that solid state technology be employed for controlling AC power in an off/on switching mode. This technology utilized a variety of sophisticated techniques for supplying a continual signal drive to the control terminal of a solid state controlled switch so that during the half-cycle of AC line commutation where the solid state control switch would shut off it would see continual control terminal drive signals in synchronism therewith whereby the switch would remain in on condition. The circuitry involved with these techniques was quite complex and expensive whereby the same has not achieved widespread commercial success.

A simpler form of latching mode is described in U.S. Pat. No. 3,493,791 issued Feb. 3, 1970 to the assignee of the instant application, wherein a solid state controlled switching device is described which is latched on using a large capacitor from its control terminal to its cathode, the enabling thereof being furnished from a preliminary stage which is also shown as a solid state controlled switching device.

It also has been proposed to drive a solid state switching device by a transistor in a momentary mode as opposed to a latching mode. However, none of the prior art solid state switching device circuitry discloses an on latching mode for a solid state switching device which is driven by a solid state device such as a transistor or other three-or-more electrode sensitive solid state element wherein the solid state switching device is latched on using capacitive latching, nor are any such devices provided with disabling circuitry furnished through the medium of a transistor or other such three-or-more electrode solid state element to sap, i.e. weaken, drive signals from a latching capacitor such that it cannot maintain the latching or on condition of the solid state controlled switching device which thereupon proceeds, upon energization of the disabling circuitry, to be turned to off condition.

SUMMARY OF THE INVENTION

1. Purposes of the Invention

It is an object of the invention to provide, generally, in the functional context of a lamp, off/on solid state switching circuitry that is simple, inexpensive, highly reliable, constitutes relatively few parts and is operable independently of a wide range of load environmental parameters to which a lamp is subjected in every-day use such, for example, as variation in load voltage, temperature variations, humidity variations and load variations, which prevent known prior art techniques from functioning reliably.

It is another object of the invention to provide a lamp which is operated in both off and on modes by touching, solely through the medium of solid state circuitry.

It is another object of the invention to provide a lamp of the character described which includes two touch antennae and circuitry such that when one of the antennae is touched the lamp is turned on and when the other antenna is touched the lamp is turned off.

It is another object of the invention to provide a lamp of the character described in which the touch antennae are of ring-like configuration and vertically spaced apart so that a person desiring to turn the lamp on in a dark room and remembering the location of the lamp merely has to reach for the portion of the lamp having the antennae thereon and then brush his fingers up or down depending upon whether the on antenna is below or above the off antenna, respectively, and can thereby with great ease in the dark turn the lamp on in contradistinction to the operation of the present conventional switching means which requires groping for a mechanical switch before actuating the same; this latter technique requires a far more precise recollection of the location of the switch than does a lamp embodying the present invention.

It is another object of the invention to provide a lamp of the character described which is capable of mass production at a comparatively low cost so that it lends itself to ready adaptation by the public, not being unduly encumbered by abnormally high prices for the unique switch in such a lamp.

It is another object of the invention to provide a lamp of the character described employing a switch such as mentioned which thereby blends into the appearance of the various configurations of the lamp and does not present the usual ungainly appearance of a conventional mechanical switch.

It is another object of the invention to provide a touch lamp with a source of light, a support, touch means which is immobile, i.e., includes no moving parts, and totally solid state circuitry to turn the light source off and on upon suitable activation of the touch means, the solid state circuitry being energized by, i.e., connected to, an AC source of power.

It is another object of the invention to provide for a source of light touch means which is immobile, i.e., includes no moving parts, and which is remote from the source of light, and totally solid state circuitry to turn the light source off and on upon suitable activation of the touch means, the solid state circuitry being energized by, i.e., connected to, an AC source of power.

It is another object of the invention to provide an electrically actuatable load, a structure for supporting the load, touch means which is immobile, i.e., includes no moving parts, and is carried by the supporting structure, and totally solid state circuitry to energize or de-energize the load, the solid state circuitry being powered by, i.e., connected to, an AC source of power.

It is another object of the invention to provide a device of the character described in which the supporting structure which carries the touch means is electrically non-conductive.

It is another object of the invention to provide touch contact means and associated highly reliable, simple, totally solid state circuitry to replace the mechanical switch on a lamp, the switch and circuitry presenting minimal restriction on the lamp structure itself other than excluding an all-metallic, i.e., conductive, and not coated, lamp base, and, generally, minimizing the use of metallic components so that the new concept provides many novel design and construction possibilities which hitherto could not be fully exploited.

It is another object of the invention to provide a lamp having a non-metallic base provided with ring-like vertically spaced metallic touch means with electrically non-conductive structure separating the rings and separating the lowermost ring from a supporting surface to limit or discourage coupling of the off and on solid state stages and interactive coupling of these stages to ground.

It is another object of the invention to provide for an electrically actuatable load a touch control means, totally solid state two-wire circuitry associated with said touch control means (two-wire in the sense that the touch control circuitry only requires two wires for integration with the load and the power source), a controlled solid state switching device such, for example, as a silicon control rectifier which is part of the solid state circuitry, capacitive latching means for maintaining the controlled solid state device in an on mode, a disabling means for rendering the latching means selectively ineffective, the solid state circuitry being connected to an AC source of power, and a full-wave rectifier interposed between the solid state circuitry and the AC source of power.

Other objects of the invention in part will be obvious and in part will be pointed out hereinafter.

2. Brief Description of the Invention

A lamp with touch control means preferably in the form of two touch antennae, these preferably being ring-like, concentric and vertically spaced apart and electrically insulatively supported, the touch control means being associated with totally solid state controlled circuitry that derives energy from an AC source of power in a fashion such that it supplies the lamp, when the circuitry is in an on mode, with full-wave pulsating DC. The circuitry includes an enabling means such as a capacitive latching means to maintain the circuitry in an on mode after the touch control means has been activated and is no longer touched. The circuitry further includes disabling means for rendering the enabling means ineffective when the touch control means is subsequently contacted. The circuitry additionally includes a solid state switching device which is converted to an on mode when the touch control means is contacted at such time as the switching device is in an off mode, the switching device being maintained in the on mode by the enabling means and being converted to the off mode when contacting the touch control means causes the disabling means to render the enabling means ineffective. The conversion of the solid state switching device from off to on mode occurs at a commutation point.

The lamp may be of the incandescent and, therefore, essentially resistive, type, or of the fluorescent type and, therefore, of the essentially inductive type. The circuitry may be of the three-wire or two-wire type. The circuitry is designed to operate on a full-wave basis, either through the use of a rectifying bridge or back-to-back solid state switching devices, one of which conducts in one direction and the other in the opposite direction.

In the preferred form of the invention the circuitry includes a solid state device such, for example, as a transistor which is rendered conductive upon contacting the touch control means and which turns the switching device on, at the same time rendering the enabling means effective. Preferably also the circuitry has another transistor, or the like, which when the touch control means is contacted functions as the disabling means to render the enabling means ineffective.

The touch control means, instead of being of metallic opaque form, may constitute one or more electrically conductive transparent members such, for example, as are described in co-pending application Ser. No. 112,148 filed Feb. 3, 1971, for "TRANSPARENT TOUCH CONTROLLED INTERFACE WITH INTERREACTIVELY RELATED DISPLAY", by Harold Barkan, Edward D. Barkan and Jerome Swartz.

Furthermore, the lamp may include a transparent portion behind the touch control means and a source of illumination behind the transparent portion, the source of illumination being energized when the solid state switching device is in off mode, thereby giving off a slight illumination which is not enough to distract a person trying to sleep but is sufficient to gently disclose the location of the touch control means so as to make it easier to locate the same in an otherwise-unilluminated room.

Still further, the lamp may include a transparent portion with or without a superimposed magnifying means, means behind the transparent portion to receive a transparency such as a photographic slide, and a source of illumination behind the transparency-receiving means, the source of illumination being energized by the solid state circuitry for controlling the lamp, the arrangement preferably being such that the source of illumination is rendered effective when the solid state switching device is in its off mode so that in such manner the transparency is displayed when the lamp is off. The source of illumination for the transparency and the night light can be incandescent, or glow, i.e., gaseous discharge, or electroluminescent and, desirably, is supplied with power by leak circuitry which is in shunt with the solid state switching device so that it is rendered effective when the solid state switching device is nonconductive.

The solid state switching device may be of a four-layer semiconductor controlled rectifier type which is commercially available under various trade names such as Silicon Controlled Rectifier (SCR), Silicon Controlled Switch (SCS), Gate Turn-Off Switch, Transswitch, Trinistor, Binistor, Trigistor and Thyristor. Another useful type of switching device is a Triac.

The solid state element interposed between the touch control means and the solid state switching device may constitute a transistor connected to apply "switch-on" potential to the control terminal of the solid state switching device upon an operator contacting the touch control means, and the disabling means may constitute another transistor connected to shunt the enabling means when the touch control means is contacted at such time as the solid state switching device is in an on mode. The transistors just described essentially constitute control means or a "front end" for the solid state switching device and the latching means. In lieu thereof, alternate front ends such as a field effect transistor (FET) or transistors arranged in Darlington configuration can be utilized.

Instead of using ring-like contact means for controlling the off and on mode of the solid state switching device, the contact means may be so shaped or have associated therewith indicating means that a user can readily ascertain which is the on touch contact and which is the off touch contact. Thus, with ring-like touch contact means in vertically stacked configuration, either the upper or lower of the ringlike means may be the off touch contact and the other the on touch contact, and some members of the public might not care to have to remember which contact means is which. This can be avoided in the fashion indicated above by suitable associated means. For example, the on contact may be colored green and the off contact colored red, or the touch contact means may be in the shape of discs simulative of traffic lights, one of which is colored red and the other green, the red touch contact being vertically above the green touch contact in the familiar manner of traffic signals. Also, the touch contacts could be in the shape of words such as "on" and "off". Furthermore, where the touch contacts have associative control indications or configurations, said touch controls may be transparent and affiliated with one or more sources of illumination which is particularly desirable for assisting a user in locating the on touch control in the dark.

Although the preferred form of the invention utilizes two touch control elements for the touch control means, one being for the off mode and the other for the on mode, inasmuch as it is believed that most users would prefer two separate entities, each of which has a different individual function, the invention contemplates the utilization of but a single touch control element, the element being associated with an element of solid state circuitry of a flip-flop nature along with the aforementioned front end and power handling solid state switching device whereby if the solid state switching device is in the off mode and the single touch element is contacted by a user the flip-flop circuitry will energize the front end transistor which turns on the solid state switching device, and the next contacting of the touch control element will reverse the flip-flop to energize the front end portion that constitutes the disabling means for the purpose of rendering the latching means ineffective.

The lamp can assume any form depending upon potential public demand and manufacturers' designs. It may be a conventional lamp such as a table lamp, floor lamp, wall lamp, suspended lamp, pole lamp, a lamp incorporated in a room divider or panel, or a lamp incorporated in a piece of furniture.

The solid state circuitry described above is also useful for supplying power to or cutting power off from other type devices within the capacity of the solid state switch, examples thereof being household appliances, both of the portable and built-in type, or, in general, any electrical equipment.

Yet another application of the invention is to have the electrical lamp remote from the solid state switching circuit. For example, the electric lamp may be a built-in lamp such as a ceiling lamp or indirect lighting, and the solid state circuitry together with its touch control means can be mounted on a wall of a room.

A further application of the invention is to incorporate the touch contact means and load into a toy wherein spaced portions of the toy such, for instance, as the hands of a toy figurine, are provided with on and off touch contact elements and the load constitutes an illuminatable portion of the toy or motor to move a component of the toy, so that a child, for instance, upon shaking a hand of a Santa Claus figurine, will experience a return shake or see the eyes or head of the figurine light up.

The solid state switching device and associated circuitry and load furthermore may be made a part of a toy which is so constructed that if it incorporated a mechanical switch difficulty would be experienced in operating the switch because the switch is so located and the toy is so constructed that insufficient resistance to the force applied to operate the switch could be supplied. In a case such as this an effort to operate the switch only would result in movement of the switch along with the toy, and the actuating means for the switch would not be so supported that it could be operated. The touch contact means of the present invention, however, overcomes this difficulty because when incorporated in such a toy or device it will enable a power-handling solid state switch to be turned to an off or on mode merely upon contact and without the application of more than a very slight pressure. This arrangement is quite useful, for instance, in a toy which includes an element supported on a light coil spring and it is desired to have the switch on the spring-mounted element. Using the touch contact means and circuitry of the present invention the spring-mounted element will not be deflected when a person places a finger on the touch contact means.

A further application of the invention is in the use of the same to create a lamp in which there seems to be no switch control elements at all. For example, a lamp may very largely consist of a transparent shade or housing for an electric light and the touch contact means may be in the form of transparent electrically conductive elements on the exterior of the shade or housing so that the same are not noticeable and, therefore, do not detract from the more pleasing esthetic appearance provided by the lamp. In this case the solid state circuitry will be incorporated in an inconspicuous part of the lamp such, for instance, as in the base where it will not interfere with the aforesaid pleasing effect.

The invention additionally may provide different stages of illumination. Thus, the circuitry associated with the solid state power-handling switch can include means under the regulation of a first signal supplied from one on touch control element to supply half-wave power to the solid state power-handling switch, and another means under the regulation of a second signal supplied from another on touch control element to supply full-wave power to the solid state power-handling switch. Thereby the lamp connected to the power-handling switch can be turned on in a half-wave mode of operation which would constitute dim illumination, or a full-wave mode of operation constituting normal illumination. Such a circuit also would include a third touch contact element which would supply the signal to activate the disabling means in order to render the latching means ineffective when the lamp is to be turned off.

The invention consists in the features of construction, combination of elements and arrangement of parts which will be exemplified in the device hereinafter described and of which the scope of application will be indicated in the appended claims.

BRIEF DESCRIPTION OF THE DRAWINGS

In the accompanying drawings in which is shown one of the various possible embodiments of the invention.

DESCRIPTION OF THE PREFERRED EMBODIMENT

Figure 1:
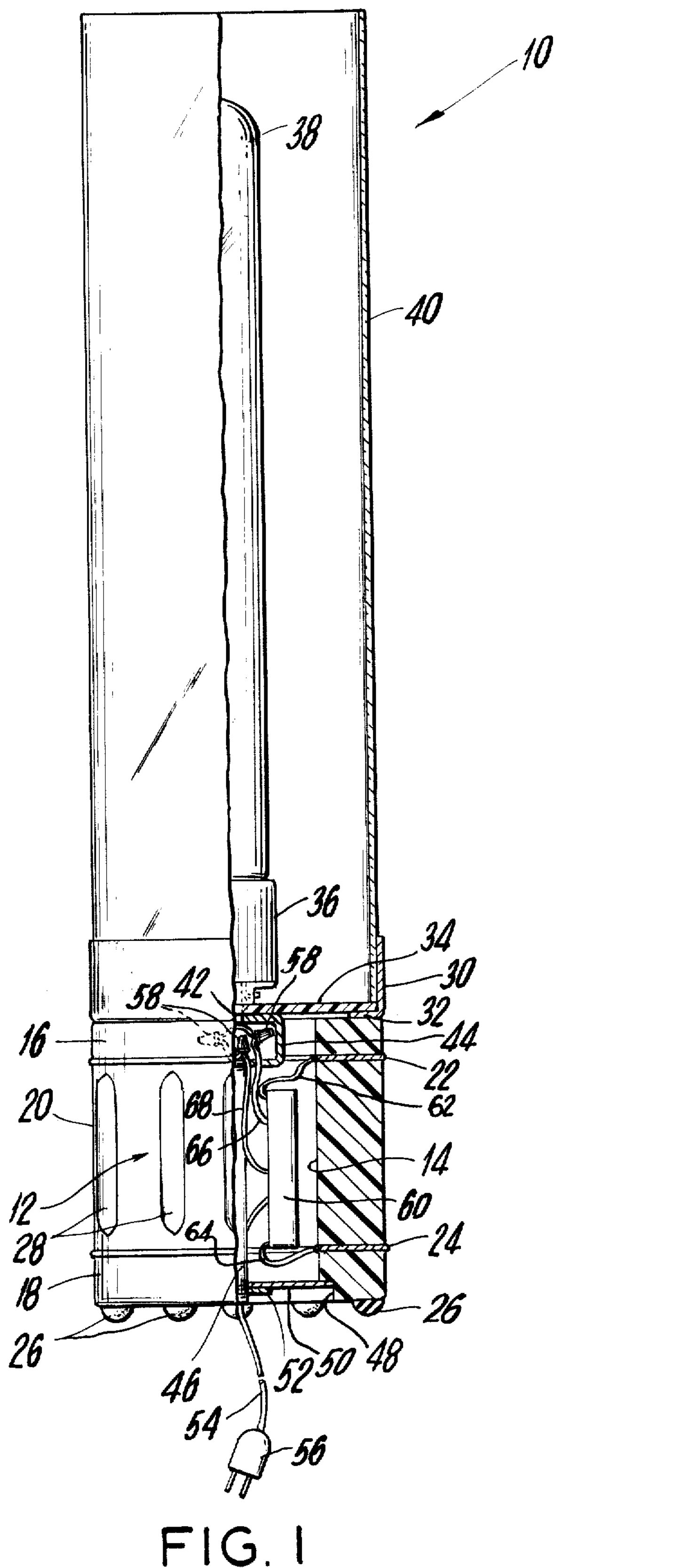
FIG. 1 is a plan half-sectional view of a lamp constructed in accordance with the invention.

Referring now in detail to the drawings and, more particularly, to FIG. 1, the reference numeral 10 denotes a lamp embodying the invention. The general construction of the lamp is not a feature of the invention, although the lamp illustrated has a quite pleasant and attractive appearance rendered possible by the incorporation of the invention. However, the physical arrangement of the base, the shade for the electric bulb, the electric bulb itself, the socket for the bulb and the lead-in wire are essentially conventional, the inventive features residing in the touch controlled totally solid state switch including the circuitry therefore and the touch contact elements thereof. More specifically, the lamp 10 includes a base 12 of electrically non-conductive material. As illustrated, the base is in the shape of a plastic cylinder having a central bore 14. The cylinder is subdivided into top and bottom discs 16, 18 and a central disc 20. The top and bottom discs are separated from the top and bottom surfaces, respectively, of the central disc by electrically conductive wafers 22, 24, the wafer 22 being the uppermost and the wafer 24 being near the bottom of the base. The external diameters of the wafers are slightly in excess of the external diameter of the base 12 so that the wafers protrude slightly therefrom, for example, in the neighborhood of 1/32 inch. Desirably, the protruding edges of the wafers are rounded so as to prevent the presentation of any sharp, possibly damaging, edges, and also to blend in nicely with the external surface of the base. The wafers 22, 24 constitute touch contact elements, the upper wafer 22 being the OFF touch contact, and the wafer 24 being the ON contact. The connection of these wafers with the solid state switch circuitry will be described hereinafter.

The wafers have large central openings which are concentric with the longitudinal axis of the base and which protrude slightly into the bore 14 sufficiently for connection to the solid state switch circuitry of which they form a part. Optionally, the internal peripheries of the wafers may be provided with lugs for such electrical connection. Due to the electrically non-conductive nature of the top, bottom and central discs 16, 18 and 20, the wafers are electrically insulated from each other and from any surface on which the lamp rests.

The bottom surface of the bottom disc 18 may be provided with legs such as hemispherical rubber feet 26 so that the lamp will not scratch a finely finished surface. As a matter of decorative appearance, the external surface of the central disc may be provided with shallow vertical equiangularly-spaced flutes 28.

The upper surface of the top disc 16 concentrically supports a ferrule 30 which may be of metal. The ferrule is not electrically connected to any part of the lamp which carries line or even signal potential, so that the ferrule is inert electrically. It serves a purely physical purpose. The lower end of the ferrule has an inturned flange 32 through which the ferrule is connected to the base as by adhesive. Seated on the upper surface of the flange 32 is a metal retainer plate 34 having a central aperture. Said plate serves to support and position a socket 36 for an electric bulb 38. A cylindrical tubular lamp shade 40 encompasses the elongated electric bulb 38 and extends somewhat above the same. The lower end of the shade 40 is receivably snugly fitted into the ferrule 30, the fit being a frictional fit so that the shade tends to remain in place against inadvertently and accidentally externally applied forces, even inversion of the lamp. However, the shade 40 can be deliberately withdrawn from the ferrule when it is desired to replace the bulb 38. The lower portion of the socket 36, as is usual, includes a tapped opening in which there is received the upper end of a nipple 42. The lower end of the nipple is screwed into a tapped opening at the upper segment of a hickey 44. The lower segment of the hickey likewise is provided with a tapped opening, as is conventional, this opening being in registry with the upper opening. The lower opening has screwed into it the threaded upper end of a short length of tubing 46. The socket, the nipple, the registered openings in the hickey and the tubing 46 are concentrically disposed about the longitudinal axis of the base 12. The tubing and hickey are located in the bore 14.

The bottom disc 18 includes at its lower end an enlarged central recess 48 in which there is seated a metallic retainer plate 50 having a central opening through which the lower end of the tubing 46 extends. A nut 52 is screwed onto the threaded lower end of the tubing and when tightened pulls the socket 36 against the upper retainer plate 34, thus physically holding together the socket-associated components of the lamp.

A twin lead wire 54 runs through the tubing 46 into the open portion of the hickey. The lead wire terminates externally of the lamp at a duplex plug 56 adapted to be inserted in a standard electrical wall outlet such, for instance, as a 110-volt AC household outlet. The ends of the twin lead wire which terminate in the open space of the hickey are connected by wire nuts 58 to the lamp socket and to a totally solid state electric switch 60. The switch is composed of certain elements hereinafter described in detail and illustrated in FIG. 2. Preferably, the switch constitutes a printed circuit on a circuitboard with the sundry elements carried thereby and the entire switch being encapsulated, i.e., potted, so that it can be easily handled. The switch has four terminals, two of which are connected by leads 62, 64 to the wafers 22, 24, respectively. The other two terminals are connected by leads 66, 68 to the twin lead wire and socket. These connections are also illustrated in FIG. 2.

Figure 2:
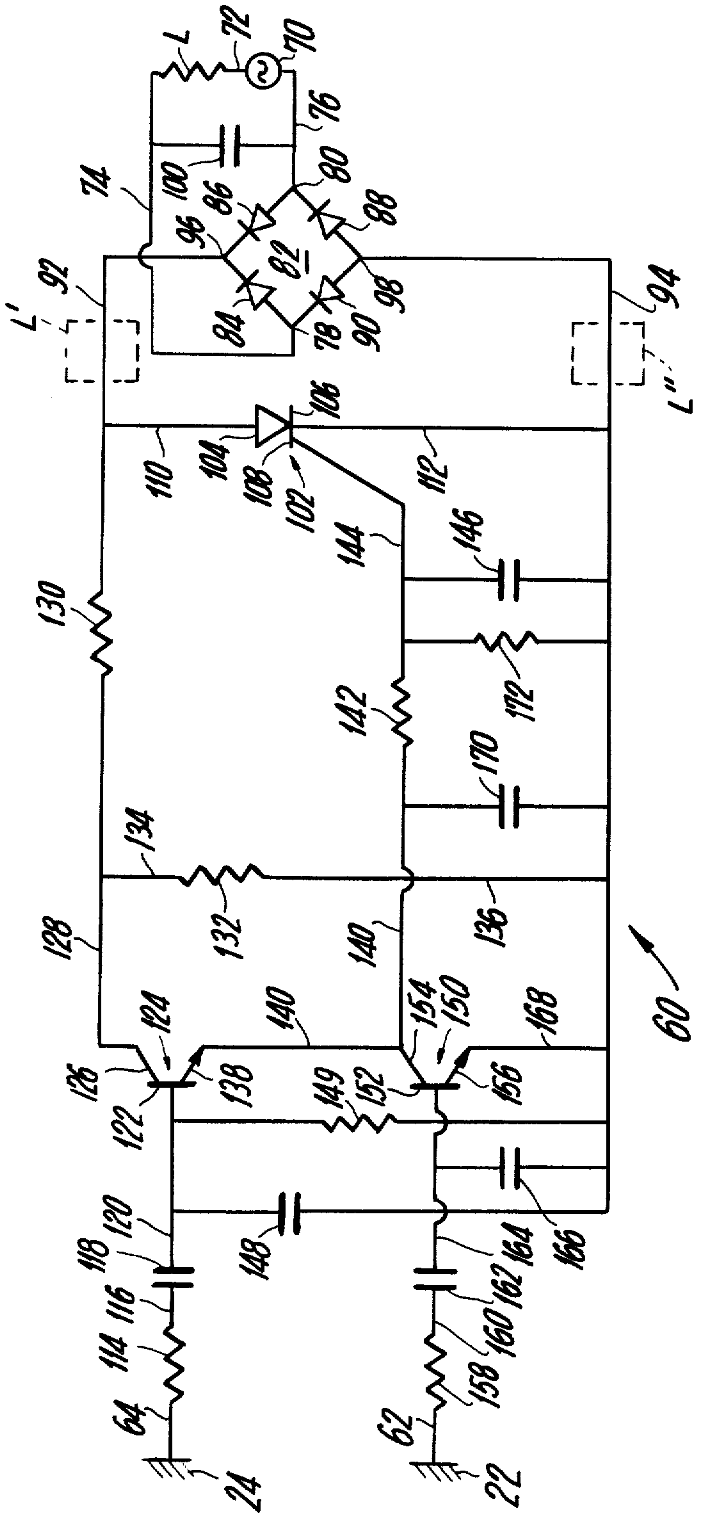
FIG. 2 is an electrical diagram of the solid state circuitry for turning the electric light source of FIGS. 1 and 2 off and on via touch control means.

Referring now to FIG. 2 which illustrates the circuitry for the totally solid state electric switch 60, the reference numeral 70 denotes an AC source of power. This may be the usual 117-volt (average) RMS line voltage found in most U.S. cities. The values of the circuit about to be described are so designed that a reasonable latitude of the voltage of the source will not alter the operation of the circuit. The values of the said elements are such that the circuitry will function in an RMS AC line voltage range between about 70 and 130 volts. It is, of course, well understood that the 117-volt RMS AC voltage has a voltage peak of about 170 volts.

Said source of power is connected by a lead 72 to one side of a load L such, for example, as the electric bulb 38. However, the load has been indicated schematically inasmuch as the circuit can be employed to turn any load off or on. The load here shown is essentially resistive, although it may include a small inductive component inasmuch as the filament of the electric bulb usually will be of the conventional double-helix type. From the other end of the load and from the other terminal of the source of power leads 74, 76 run to power input terminals 78, 80 of a full-wave rectifying bridge 82 composed of solid state diodes 84, 86, 88, 90 arranged in full-wave rectifying configuration. The specific diodes employed are not here defined. However, these diodes and, indeed, all of the other components of the switch 60, will have typical values listed, said values being for purposes of illustration only and not to be considered as limiting on the invention. Leads 92, 94 run from the output terminals 96, 98 of the bridge 82. A smoothing capacitor 100 bridges the AC power leads 74, 76.

A power-handling solid state controlled switch 102 is connected across the full-wave rectified leads 92, 94. This switch is selected to be able to accommodate the power required in the load L. In a typical lamp application of the invention said switch is selected to handle power up to approximately 100 watts, and the specific switch 102 hereinafter specified has that capacity. As mentioned previously, the switch can be any one of various types, examples of which are an SCR, an SCS, a Gate Turn-Off Switch, a Transswitch, a Trinistor, a Binistor, a Trigistor and a Thyristor. An SCR is employed in the preferred form of the invention. The SCR has an anode 104, a cathode 106 and a control terminal 108. Power leads 110, 112 connect the anode and cathode, respectively, to the full-wave rectified leads 92, 94. The foregoing constitutes the power-handling end of the switch 60.

Turning now to the front end of the switch, which might also be considered to be the control end for turning the SCR off and on and for holding the SCR on once it has been turned on, the same is activated by the antennae 22, 24, these being also herein referred to as "touch contacts". The antenna or touch contact 22 is the OFF contact, and the antenna or touch contact 24 is the ON contact. The on contact 24 is connected by the lead 64 to an isolation resistor 114 and then in series through a lead 116 to an isolation capacitor 118 connected still in series through a lead 120 to the base 122 of a preamplifier n-p-n transistor 124. The collector 126 of the transistor 124 is connected by a lead 128 to one terminal of a resistor 130, the other terminal of which is connected to the full-wave rectifier lead 92. The resistor 130 is one resistance section of a voltage dividing network, the other resistance section of which constitutes a resistor 132. One terminal of the resistor 132 is connected by a lead 134 to the lead 128, and the other terminal of the resistor 132 is connected by a lead 136 to the lead 94. The transistor 124 has an emitter 138 connected by a lead 140 to one terminal of a resistor 142, the other terminal of which is connected by a lead 144 to the control terminal 108 of the SCR 102. It may be mentioned that the control terminal 108 is a cathode gate terminal.

A latching capacitor 146 is connected across the leads 94, 144. If desired, the load L may be inserted directly in the cathode or anode circuit of the SCR 102 instead of in the circuit between the source of AC power and the rectifying bridge as has been described above. Such alternate positions of the load are indicated by the reference numerals L′ and L″ in dotted lines. It will be observed that either of these alternate positions of the load make the switch 60 a three-wire switch instead of a two-wire switch, the latter being the type of switch illustrated with the load in the bridge-to-AC power supply.

A filter capacitor 148 and a filter resistor 149 are connected in parallel across leads 94, 120.

As will be pointed out hereinafter, when the antenna 24 is touched a signal will be generated which is amplified by the transistor 124 and fed to the gate terminal 108 of the SCR to turn the same on. Due to the pulsating nature of the rectified current supplied to the power terminals of the SCR, if contact with the antenna 24 is broken as by removing a user's finger from this contact, the SCR would turn off as soon as the following commutation point in the power supply was reached. This would mean that the on contact would only function in a momentary manner, remaining on so long as the antenna was touched. Obviously, this is impractical for a load such as a lamp which should be steadily maintained in an energized condition until it is deliberately deenergized. The latching capacitor 146, however, maintains a control signal which holds the SCR in conductive mode across successive commutation points.

In order to turn the SCR off, means is provided to sap the charge on the latching capacitor 146. Said means constitutes another n-p-n transistor 150 having a base 152, a collector 154 and an emitter 156. The lead 140 is connected to the collector 154. The base 152 is connected to the off antenna 22 through the lead 62, an isolation resistor 158, a lead 160, an isolation capacitor 162 and a lead 164, all in series. A capacitor 166 is connected between the leads 94 and 164, the same constituting a suppression capacitor to suppress radio frequency currents and to control sensitivity. It also acts as a high-pass filter. The emitter 156 is connected to the lead 94 by a lead 168. A capacitor 170 is connected between leads 94 and 140. A resistor 172 is connected between leads 94 and 144 in parallel with the latching capacitor 146.

The following is a list of typical values and types for the sundry elements described in connection with the switch 60:

| REFERENCE NO. | PART | VALUE OR TYPE |
|---|---|---|
| 114 | Resistor | 500 K ohms |
| 130 | Resistor | 470 K ohms |
| 132 | Resistor | 33 K ohms |
| 142 | Resistor | 1 K ohms |
| 149 | Resistor | 1 M ohm |

-Continued

| REFERENCE NO. | PART | VALUE OR TYPE |
|---|---|---|
| 158 | Resistor | 500 K ohms |
| 172 | Resistor | 50 K ohms |
| 100 | Capacitor | 0.01 mfd |
| 118 | Capacitor | 680 pf |
| 146 | Capacitor | 0.1 mfd |
| 148 | Capacitor | 300 pf |
| 162 | Capacitor | 1000 pf |
| 166 | Capacitor | 200 pf |
| 170 | Capacitor | 0.1 mfd |
| 122 | Transistor | 2N5172 |
| 152 | Transistor | 2N5172 |
| 102 | SCR | GE C106B |
| 84 | Diode | 1N4003 |
| 86 | Diode | 1N4003 |
| 88 | Diode | 1N4003 |
| 90 | Diode | 1N4003 |

To describe the operation of the switch 60, let it be assumed that the lamp 10 is deenergized and that the power-handling SCR 102 is in a non-conductive mode. To switch the SCR into a conductive mode (enable said SCR) and hold the same on, i.e., in conductive mode, by energizing the latching capacitor 146 (as well as the latching capacitor 170), the on wafer 24 is momentarily touched by a user (although it is impractical to consider any touching other than by a user's hand or fingers but touching can be performed by any electrically conductive element held by a user). This is the bottom wafer that serves as an on touch antenna. It should be noted that although the touching of the on contact may be momentary, this being sufficient to energize the electric bulb and hold it on in a manner soon to be described, touching may be maintained as long as the user desires, although no useful purpose is served by having the user persist in this contact.

The signal flow for the enabling circuit that turns on the SCR 102 is as follows:

In the off state of the lamp with no current flowing, the entire line voltage from the source of power 70 appears across the power terminals 104, 106 of the SCR 102 which likewise is off. This voltage is approximately 170 volts peak due to the 117-volt AC RMS voltage that is normally present in domestic power lines in the U.S.; however, it should be mentioned that the switch 60 will function satisfactorily with line voltages ranging between 70 and 130 volts AC with the values given above for the components of the circuit.

The line voltage is reduced by the voltage dividing network constituting the resistors 130, 132. This voltage in the off state of the switch 60 allows approximately 20 volts to appear across the enabling sensitive preamplifier transistor 124. Such voltage is selected to be below the breakdown voltage for said transistor. It is to reduce the voltage to this level, in the off stage of the switch 60, that the voltage dividing network aforesaid is employed.

When a person touches the on antenna 24 he supplies a 60-cycle signal which passes through the lead-in resistor 114 and capacitor 120 on its way to the base 122 of the preamplifier transistor 124. Said resistor and capacitor provide isolation safety for the person and, moreover, provide a series filter that peaks the 60-cycle signal coupled by the person to activate the transistor 124 to its on region. Said resistor and capacitor also suppress or attenuate high frequency or radio or stray noise that may enter the circuit from any source by radiation or otherwise. Said resistor and capacitor pass the current signal which is generated through the ground path and body of the user back to the power line to which the switch 60 is connected. The aforesaid electric signal is minute, in the order of less than a microampere. The signal is transmitted through the resistor 114, the capacitor 120 and the capacitor 148 to ground. The capacitor 148 with the resistor 149 also serves as a gain suppression for the transistor 124 so that the latter will not be overly sensitive and susceptible to proximity operation. The aforesaid small normally submicroampere signal is conducted into the base of the preamplifier transistor 124 where it is boosted in amplitude by flow of current from the collector 126 to the emitter 138. This boost takes place because the transistor 124 has a high DC-beta. $h_{FE}$ the DC short circuit gain is an important parameter and it is selected to be sufficiently high, for example, in the range from 20 to 80, and limited to a small variation whereby to achieve the desired boost.

The amplified signal is then conducted through the base and emitter of the transistor 124 to the gate of the SCR 102. The transistor 150, which is the off or disabling transistor, is inactive, i.e., off, at this time since its antenna, i.e., top wafer 22, has not been touched, so that none of the signal to the emitter of the transistor 124 flows down to the transistor 150 but, instead, flows through the resistor 142, the capacitor 170, the resistor 172, the capacitor 146 and, finally, a substantial portion of the amplified signal flows into the gate 108 of the power-handling SCR 102. Said signal is sufficient in amplitude at the gate to turn on the SCR 102. Said SCR has a gate sensitivity well below tens of microamperes. Nominally, it can be in the order of 50–60 microamperes. Practically, it is in the range of something in the order of 10 microamperes, and samplings of large numbers of the aforesaid type used for the SCR 102 indicate variations of from less than one microampere up to about 10 microamperes for gate sensitivity. The aforesaid circuit section employing the touch on antenna and the sensitive preamplifier transistor 124 along with its affiliated solid state elements provides a sufficiently amplified touch actuation current to turn the SCR 102 on upon application to the gate 108 since that amplified current exceeds the $I_{GT}$ or gate current sensitivity of this SCR. The SCR now, i.e., by application of the aforesaid gate signal, is switched to a conductive mode so that it will pass power between its power terminals 104, 106; it should be noted that this is not the same as latching the said SCR on. At this moment in time, i.e., when the on touch contact 24 is engaged by a person, the SCR merely is turned on, and it would turn off the moment the person's touching of the contact was broken off were it not for the latching circuit.

Latching is accomplished by the use of the capacitor 146 or the use of the combination of the capacitors 146 and 170. These are electrically large capacitors and also tend to be large physically. The value of the capacities is limited by physical dimensions to be not much larger than a few tenths of a microfarad each and, as indicated above, the actual capacitance values of the two said capacitors is selected in a preferred embodiment of the switch 60 as being of a value of 0.1 mfd each. This has been found to be a sufficient capacity to latch up the SCR 102 under the conditions of use with an AC power source in the order of 117 volts RMS and the other circuit components with the values indicated. The latching up is accomplished by the fact that as the anode power starts to commutate at the end of each half cycle, at which time the SCR 102 would tend to turn off because the anode to cathode potential approaches zero, i.e., fall below the current required to continue conduction, the capacitor 146 or the combination of the capacitors 146, 170 which have been charging up during most of the preceding half on cycle can, when the AC power source starts to commutate, discharge some current in the forward direction into the gate 108 of the SCR 102 which during this interim period of forced commutation is sufficient to carry the SCR over in a conductive mode into the next half cycle.

The aforesaid latching action continues for successive half cycles as the capacitor 146 or the capacitors 146, 170 continue to charge up during the portions of the successive half cycles that the SCR continues to remain in the conductive mode and discharge over the commutating periods at the ends of such half cycles. Thereby the SCR 102 will remain on after a person has discontinued his contact with the touch antenna due to the constant retriggering of the SCR by the stored energy in the latching capacitor 146 or the combination of the latching capacitors 146, 170.

Thus, the SCR 102 remains in its on condition with full current flowing through the load, through the SCR and through the AC power line, the current being full-wave rectified by the diode bridge 82. The SCR carries on the order of 100 watts or more so that a 75-watt electric bulb 38, for example, is fully powered and fully lit..

To deactivate, i.e., to disable, the SCR 102, or, phrased differently, to turn off the switch 60 as a normal mechanical switch might do, the turn off transistor 150 is employed. When this transistor is rendered conductive it pulls down the energy stored in the capacitor 146 and the capacitor 170 which, while the SCR 102 is in its conductive mode, serve to hold it in that mode.

By touching the base 152 of the disabling (unlatching) transistor 150 through the isolating and suppressing resistor 158 and capacitor 162, the user, in a manner similar to that discussed with respect to transistor 124, couples a touch actuating microampere current to said base. The current supplied is sufficient, due to the sensitivity of the off transistor 150, to turn said transistor to an on state. Such current is, in a sense, amplified due to the fact that this is the normal operative function of a transistor. The collector voltage to the transistor 150 is essentially supplied from the gate 108 of the SCR 102, being reduced by the resistor 142, the capacitor 170, the resistor 172 and the capacitor 146. However, this voltage is quite small because during the on state of the SCR 102 the voltage from the gate 108 to the cathode 106 of the SCR 102, which basically serves as a supply for the collector 154 to the emitter 156 of the transistor 150, is only in the order of 1 volt, whereas the priming voltage, i.e., collector to emitter voltage for the preamplifier transistor 124, is essentially the full divided down voltage supplied by the resistive network 130, 132 that is in the order of 20 volts. Thereby the turn-on for activating this disabling transistor 150 into the on region is inherently much weaker than the turn-on action to its on state of the enabling transistor 124. However, the disabling transistor 150 sees a supply voltage between its collector and emitter which is sufficient to render said transistor conductive when the off contact 22 is touched. Once the transistor 150 is in a conductive mode it shifts from a resistance or impedance of a very high value between its collector and emitter which may be in the order of approximately 1 megohm, although the precise figure is not important, to a much lower value in the order of one or several K ohms. In the latter range which is in the neighborhood of 100 to 1000 times smaller resistance of impedance than in the non-conductive mode, the transistor 150 serves as a loading or pull-down component on the latching capacitors 146 and 170 so that these capacitors then discharge through the now-conductive, i.e., on, transistor 150. This provides an alternate path shunting the gate to cathode of the SCR 102, which path, when the off antenna is not touched, supplies discharge from the latching capacitors 146, 170 to retain or retrigger the SCR 102 on after the on antenna 24 has been touched. However, by touching the off antenna 22 and supplying the aforesaid relatively low impedance parallel path through the disabling transistor 150 which now is in conductive mode, sufficient current is drained away, i.e., sapped from, the energized capacitors 146, 170 to prevent retriggering of the SCR 102 during commutation at the end of the extant half cycle so that upon the occurrence of this commutation period the anode to cathode voltage drops below its maintenance value and the SCR 102 will turn off.

As indicated earlier, the aforesaid lamp 10 and the aforesaid switch 60 are capable of a variety of uses and modifications which have been mentioned under the heading "Brief Description of the Invention".

It should be further observed that a low amperage light source may be energized by the switch 60, such source being placed across the power terminals of the SCR 102. Such light source should be of high impedance and thereby will be turned on when the SCR is turned off.

Another advantage not previously mentioned for the switch 60 is its complete absence of noise. It does not create the click of a normal snap mechanical switch nor even the muted sound of a mechanical switch incorporating resilient shock-abosrbent means. It is as quiet as a mercury switch but is far more reliable, that is to say, its number of on/off cycles is almost limitless.

It thus will be seen that there is provided a device which achieves the various objects of the invention and which is well adapted to meet the conditions of practical use.

As various possible embodiments might be made of the above invention, and as various changes might be made in the embodiment above set forth, it is to be understood that all matter herein described or shown in the accompanying drawings is to be interpreted as illustrative and not in a limiting sense.

Having thus described the invention there is claimed as new and desired to be secured by Letters Patent:

1. In combination,

A. an electrically actuatable load,

B. an on touch element having no parts which are movable as a requisite to the actuation of the load, C. an off touch element having no parts which are movable as a requisite to the deactuation of the load, and D. totally solid state circuitry means to energize said load upon touching said on touch element and to de-energize said load upon touching said off touch element, E. said solid state circuitry means being engageable with so as to be energizeable by an AC source of power, said solid state circuitry means including i. input terminals connectable to said AC source of power, ii. a power handling solid state switch having a. a cathode terminal, b. an anode terminal and c. a control terminal, iii. means connecting said cathode and anode terminals through the load to said input terminals, iv. a solid state amplifier means having a. input means and b. output means, v. means connecting the amplifier input means to the touch elements, vi. means connecting the amplifier output means to the control terminal of a solid state switch whereby when said on touch element is touched the solid state switch is placed in a conductive mode and the load thereby is energized, vii. capacitor means between the cathode and control terminals, a. said capacitor means being of such value that upon energization of the solid state switch it will be charged sufficiently to latch the solid state switch in conductive mode after the same is placed in such mode, and viii. circuit means connected to the output means of the solid state amplifier means and activated by contacting the off touch element after the load is energized for discharging the capacitor means so as to disable the latching means and thereby return the solid state switch to a non-conductive mode so as to de-energize the load.

2. A combination as set forth in claim 1 wherein the load is a lamp.

3. A combination as set forth in claim 2 wherein the touch elements are rings carried by the support, electrically insulated from each other and spaced apart vertically.

4. A combination as set forth in claim 1 wherein the solid state switch is a silicon controlled rectifier.

5. A combination as set forth in claim 1 wherein the solid state amplifier means includes a pair of transistors, one associated with the on touch element and the control terminal and the other associated with the capacitor means.

6. In combination,

A. an electrically actuatable load,

B. an off/on touch means having no parts which are movable as a requisite to actuation or deactuation of the load, and C. totally solid state circuitry means to turn said load off or on upon touching said touch means, D. said solid state circuitry means being engageable with so as to be energizeable by an AC source of power, said solid state circuitry means including i. input terminals connectable to said AC source of power, ii. a power handling solid state switch having a. a cathode terminal, b. an anode terminal and c. a control terminal, iii. means connecting said cathode and anode terminals through the load to said input terminals, iv. a solid state amplifier means having a. an input and b. an output, v. means connecting the input of the amplifier means to the touch means, vi. means connecting the output of the amplifier means to the control terminal of a solid state switch whereby when said touch means initially is touched the solid state switch is placed in a conductive mode and the load thereby is energized, vii. capacitor means between the cathode and control terminals, a. said capacitor means being of such value that upon energization of the solid state switch it will be charged sufficiently to latch the solid state switch in conductive mode after the same is placed in such mode, and viii. circuit means connected to the output of the solid state amplifier means and activated by subsequently contacting the touch means after the load is energized for discharging the capacitor means so as to disable the latching means and thereby return the solid state switch to a non-conductive mode so as to deenergize the load.

7. A combination as set forth in claim 6 wherein the load is a lamp.

8. A combination as set forth in claim 6 wherein the solid state switch is a silicon controlled rectifier.

* * * * *